(12) United States Patent
Hosoya

(10) Patent No.: US 8,021,807 B2
(45) Date of Patent: Sep. 20, 2011

(54) REFLECTIVE MASK BLANK AND METHOD OF PRODUCING THE SAME, AND METHOD OF PRODUCING A REFLECTIVE MASK

(75) Inventor: Morio Hosoya, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 10 days.

(21) Appl. No.: 12/573,703

(22) Filed: Oct. 5, 2009

(65) Prior Publication Data

US 2010/0136464 A1 Jun. 3, 2010

(30) Foreign Application Priority Data

Oct. 4, 2008 (JP) ................................. 2008-259137

(51) Int. Cl.
*G03F 1/00* (2006.01)
(52) U.S. Cl. .......................................................... 430/5
(58) Field of Classification Search .............. 430/5, 322, 430/323, 324; 378/35
See application file for complete search history.

(56) References Cited

U.S. PATENT DOCUMENTS

| 6,699,625 | B2 | 3/2004 | Lee et al. | |
|---|---|---|---|---|
| 2004/0196579 | A1* | 10/2004 | Shoki | 359/883 |
| 2006/0175616 | A1* | 8/2006 | Chandhok et al. | 257/79 |
| 2007/0091420 | A1 | 4/2007 | Hosoya et al. | |
| 2007/0091421 | A1 | 4/2007 | Hosoya et al. | |
| 2007/0275308 | A1 | 11/2007 | Hosoya et al. | |
| 2008/0318140 | A1* | 12/2008 | Hayashi et al. | 430/5 |

FOREIGN PATENT DOCUMENTS

| JP | 07-027198 A | 8/1988 |
|---|---|---|
| JP | 2002-122981 A | 4/2002 |
| JP | 2005-268750 A | 9/2005 |

* cited by examiner

*Primary Examiner* — Stephen Rosasco
(74) *Attorney, Agent, or Firm* — Sughrue Mion, PLLC

(57) ABSTRACT

A reflective mask blank has a substrate, a multilayer reflective film formed on the substrate to reflect exposure light, a protective film formed on the multilayer reflective film, and an absorber film formed on the protective film to absorb the exposure light. The protective film is made of an Ru compound containing Ru and X (X being at least one kind of material selected from Nb and Zr). The protective film has an oxidized surface layer containing X as a main component. A reflective mask is obtained by forming a transfer pattern by patterning the absorber film of the reflective mask blank.

18 Claims, 2 Drawing Sheets ns application is based upon and claims the benefit of priority from Japanese Patent Application No. 2008-259137, filed on Oct. 4, 2008, the disclosure of which is incorporated herein in its entirety by reference.

REFLECTIVE MASK BLANK AND METHOD OF PRODUCING THE SAME, AND METHOD OF PRODUCING A REFLECTIVE MASK

This application is based upon and claims the benefit of priority from Japanese Patent Application No. 2008-259137, filed on Oct. 4, 2008, the disclosure of which is incorporated herein in its entirety by reference.

BACKGROUND OF THE INVENTION

This invention relates to a reflective mask for exposure which is for use in manufacture of a semiconductor device and the like, a reflective mask blank as an original material of the reflective mask, and methods of producing the same.

In recent years, the advance of miniaturization of semiconductor devices awakens expectations of using EUV lithography as an exposure technique using extreme ultra violet (hereinafter abbreviated to EUV) light in the semiconductor industry. Herein, the EUV light represents light in a wavelength band of a soft X-ray region or a vacuum ultraviolet region and, specifically, light having a wavelength of approximately 0.2 to 100 nm. As a mask for use in the EUV lithography, a reflective mask for exposure is proposed, for example, in JP-B-H07-27198 (Patent Document 1).

The reflective mask of the type comprises a substrate, a multilayer reflective film formed on the substrate to reflect exposure light, and a patterned absorber film formed on the multilayer reflective film to absorb the exposure light. The exposure light incident to the reflective mask mounted to an exposure apparatus (pattern transfer apparatus) is absorbed in an area where the absorber film is present. On the other hand, in another area where the absorber film is not present, the exposure light is reflected by the multilayer reflective film to form an optical image which is transferred onto a semiconductor substrate through a reflective optical system.

As the above-mentioned multilayer reflective film, for example, which is adapted to reflect the EUV light having a wavelength of 13 to 14 nm, there is known a multilayer film comprising Mo and Si thin films each having a thickness of several nanometers and alternately laminated in about 40 to 60 cycles or periods, as shown in FIG. 3. In order to increase a reflectance of the multilayer reflective film, it is desired that the Mo film having a high refractive index is located at an uppermost layer. However, Mo at the uppermost layer is easily oxidized in contact with air. This results in decrease in reflectance. In view of the above, the Si film is located at the uppermost layer to serve as a protective film for preventing oxidation.

JP-A-2002-122981 (Patent Document 2) discloses a reflective mask comprising a multilayer reflective film composed of Mo films and Si films alternately laminated, an absorber pattern formed on the multilayer film, and a buffer layer of ruthenium (Ru) formed between the multilayer reflective film and the absorber pattern.

SUMMARY OF THE INVENTION

In Patent Document 1, the Si film is located at the uppermost layer as the protective film. In this case, if the Si film is thin, a sufficient anti-oxidation effect is not achieved. Therefore, the Si film generally has a large thickness sufficient to prevent oxidation. However, since the Si film slightly absorbs the EUV light, the large thickness of the Si film disadvantageously results in decrease of the reflectance.

Patent Document 2 discloses the Ru film formed between the multilayer reflective film and the absorber pattern. However, the Ru film is disadvantageous in the following respects.

(1) In a production process of a reflective mask using the reflective mask blank or in use of the reflective mask, cleaning is repeatedly performed by the use of various chemicals. Therefore, not only the absorber film but also the protective film formed on the multilayer reflective film to protect the multilayer reflective film desirably has an excellent chemical resistance.

However, the Ru protective film is low in resistance against ozone-water cleaning to be performed upon occurrence of haze in the reflective mask and, therefore, can not sufficiently be cleaned. It is therefore desired to improve the chemical resistance of the protective film formed on the multilayer reflective film.

(2) The multilayer reflective film of the reflective mask is required to withstand an environment during pattern formation of the absorber film or during pattern formation of the buffer film formed between the multilayer reflective film and the absorber film. Thus, upon selection of a material of the protective film formed on the multilayer reflective film, it is also required to consider a condition that a high etching selectivity is assured with respect to the absorber film or the buffer film. As a material of the absorber film or the buffer film, a Ta-based material or a Cr-based material is frequently used but use of various other materials is also proposed. In order to pattern the absorber film or the buffer film, dry etching is generally used. As a dry etching gas, a fluorine-based gas, a chlorine-based gas, or a mixture of oxygen and a chlorine-based gas, a mixture of oxygen and a fluorine-based gas, and so on is selectively used depending on the material of the absorber film or the buffer film. Therefore, the material of the protective film formed on the multilayer reflective film desirably has an excellent resistance against any dry etching environment depending on the material of the absorber film or the buffer film formed on the protective film.

For example, a Cr-based buffer film is patterned by dry etching using a mixture of oxygen and a chlorine-based gas. The above-mentioned Ru protective film is low in etching resistance particularly against an oxygen-added chlorine-based gas containing 70% or more oxygen. This results in occurrence of damage in the multilayer reflective film to cause decrease in reflectance.

It is therefore an object of this invention to provide a reflective mask blank having a protective film which is formed on a multilayer reflective film and which is excellent in chemical resistance during cleaning in a production process of a reflective mask using the reflective mask blank or in use of the reflective mask, and to provide a reflective mask produced by the use of the above-mentioned reflective mask blank.

It is another object of this invention to provide a reflective mask blank excellent in resistance against an environment during pattern formation of an absorber film or a buffer film formed on a multilayer reflective film, and to provide a reflective mask produced by the use of the above-mentioned reflective mask blank.

In order to solve the above-mentioned problems, this invention has following structures.

(Structure 1)

A reflective mask blank comprising a substrate, a multilayer reflective film formed on the substrate to reflect exposure light, a protective film formed on the multilayer reflective film to protect the multilayer reflective film, and an absorber film formed on the protective film to absorb the exposure light, wherein the protective film is made of a ruthenium compound containing ruthenium (Ru) and X (X being at least one kind of material selected from niobium (Nb) and zirconium (Zr)) and has an oxidized surface layer containing X as a main component.

In the structure 1, the protective film is made of a ruthenium compound containing ruthenium (Ru) and X (X being at least one kind of material selected from niobium (Nb) and zirconium (Zr)). The protective film has the oxidized surface layer containing X as a main component. Therefore, it is possible to realize the reflective mask blank and the reflective mask which have the following effects.

(1) The above-mentioned protective film is excellent in chemical resistance during cleaning in a production process of a reflective mask using the above-mentioned reflective mask blank or in use of the reflective mask. In particular, the above-mentioned protective film is high in resistance against ozone-water cleaning to be performed upon occurrence of haze in the reflective mask so that cleaning can sufficiently be carried out. Therefore, no decrease in reflectance within a reflection region for the exposure light is caused to occur.

(2) The above-mentioned protective film is also excellent in resistance against a dry etching environment of the absorber film or a buffer film formed on the protective film. Therefore, the multilayer reflective film is not damaged during patterning of the absorber film or the buffer film. Accordingly, no decrease in reflectance of the multilayer reflective film is caused to occur.

(Structure 2)

A reflective mask blank according to structure 1, wherein X is niobium (Nb).

In the structure 2, X is niobium (Nb). Therefore, the resistance against dry etching of the buffer film using an etching gas containing a chlorine-based gas is significantly improved. In addition, the chemical resistance is more effectively exhibited.

(Structure 3)

A reflective mask blank according to structure 1 or 2, wherein the protective film has a thickness within a range between 0.8 nm and 5 nm.

Preferably, the thickness of the protective film in this invention is selected within a range between 0.8 nm and 5 nm as in the structure 3. If the thickness is smaller than 0.8 nm, various kinds of resistances required as the protective film may not be obtained. On the other hand, if the thickness is greater than 5 nm, an EUV absorbance of the protective film may be increased to decrease the reflectance on the multilayer reflective film.

(Structure 4)

A reflective mask blank according to any one of structures 1 through 3, wherein the oxidized layer has a thickness within a range between 0.5 nm and 1.5 nm.

In the structure 4, the oxidized layer has a thickness within a range between 0.5 nm and 1.5 nm. Therefore, the effect of improving the dry etching resistance and the chemical resistance is maximized. In addition, no substantial decrease in reflectance occurs within the reflection region for the exposure light.

(Structure 5)

A reflective mask blank according to any one of structures 1 through 4, further comprising a buffer film formed between the protective film and the absorber film and different in etching property from the absorber film.

With the structure 5, in addition to the above-mentioned effects, the multilayer reflective film is prevented from being damaged by etching during pattern formation and pattern correction of the absorber film.

(Structure 6)

A reflective mask blank according to any one of structures 1 through 5, wherein the absorber film is made of a tantalum-based material containing tantalum (Ta).

In this invention, it is preferable that the tantalum-based material containing tantalum (Ta) is used as the absorber film as in the structure 6.

(Structure 7)

A reflective mask blank according to structure 5 or 6, wherein the buffer film is made of a chromium-based material containing chromium (Cr).

The buffer film made of a chromium-based material as in the structure 7 has a high smoothness and a surface of the absorber film formed thereon also has a high smoothness. Therefore, pattern blurring is reduced.

(Structure 8)

A reflective mask blank according to structure 7, wherein the buffer film is made of a material containing chromium nitride (CrN) as a main component.

In this invention, it is preferable that the material containing chromium nitride (CrN) as a main component is used as the buffer film as in the structure 8.

(Structure 9)

A method of producing a reflective mask blank according to any one of structures 1 through 8, wherein the protective film is deposited on an upper surface of the multilayer reflective film and thereafter a surface of the protective film is oxidized.

In the structure 9, the protective film is deposited on the upper surface of the multilayer reflective film and, thereafter, the surface of the protective film is oxidized. Thus, the reflective mask blank of this invention is easily obtained.

(Structure 10)

A method of producing a reflective mask, wherein an absorber film pattern as a transfer pattern to be transferred onto an object is formed by patterning the absorber film of the reflective mask blank according to any one of structures 1 through 8.

By producing the reflective mask using the reflective mask blank according to any one of the structures 1 through 8, it is possible to obtain the reflective mask having the protective film which is formed on the multilayer reflective film and which is excellent in chemical resistance during cleaning in a mask production process or in use of the reflective mask and also excellent in dry etching resistance in the mask production process.

According to this invention, it is possible to obtain the reflective mask blank having the protective film which is formed on the multilayer reflective film and which is excellent in chemical resistance during cleaning and so on and also excellent in resistance against an environment during pattern formation of the absorber film or the buffer film formed on the multilayer reflective film and to obtain the reflective mask produced by using the above-mentioned reflective mask blank.

DESCRIPTION OF THE EXEMPLARY EMBODIMENT

Figure 1A:
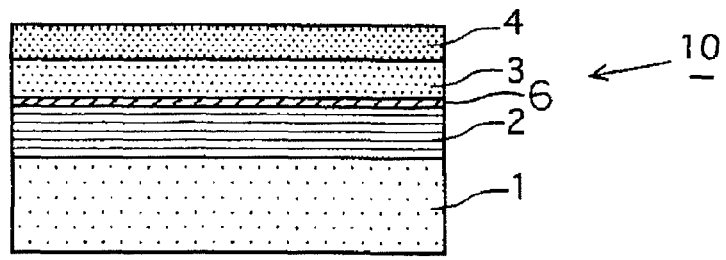
FIGS. 1A to 1D are sectional views for describing a structure of a reflective mask blank according to an embodiment of this invention and a process of producing a reflective mask by using the mask blank.

Now, an embodiment of this invention will be described in detail with reference to the drawing.

A reflective mask blank according to this invention comprises a substrate, a multilayer reflective film formed on the substrate to reflect exposure light, a protective film formed on the multilayer reflective film to protect the multilayer reflective film, and an absorber film formed on the protective film to absorb the exposure light. The protective film is made of a ruthenium compound containing ruthenium (Ru) and X (X being at least one kind of material selected from niobium (Nb) and zirconium (Zr)) and has an oxidized surface layer containing X as a main component. The oxidized surface layer is a part of the protective film and formed on the side opposite to the substrate.

In the above-mentioned reflective mask blank, the protective film is made of a ruthenium compound containing ruthenium (Ru) and X (X being at least one kind of material selected from niobium (Nb) and zirconium (Zr)) and has an oxidized surface layer containing X as a main component. Therefore, the reflective mask blank and the reflective mask having the following effects are obtained.

(1) As described above, the protective film having the oxidized surface layer is excellent in chemical resistance during cleaning in a production process of the reflective mask using the reflective mask blank or in use of the reflective mask. In particular, the above-mentioned protective film is high in resistance against ozone-water cleaning to be performed upon occurrence of haze in the reflective mask so that cleaning can sufficiently be carried out. Therefore, no decrease in reflectance within a reflection region for the exposure light is caused to occur.

(2) The above-mentioned protective film is also excellent in resistance against a dry etching environment of the absorber film or a buffer film formed on the protective film. Therefore, the multilayer reflective film is not damaged during patterning of the absorber film or the buffer film. Accordingly, no decrease in reflectance of the multilayer reflective film is caused to occur.

In this invention, a typical ruthenium compound as a material of the protective film is, for example, RuNb, RuZr, or RuZrNb.

In order to fully exhibit the above-mentioned effects, the content of Ru in the ruthenium compound is preferably within a range between 10 and 95 atomic %. In particular, in order to improve the above-mentioned effect (1) (to improve the chemical resistance), the content of Ru in the ruthenium compound is desirably within a range between 65 and 80 atomic %. In order to improve the above-mentioned effect (2) (to improve the dry etching resistance), the content of Ru in the ruthenium compound is desirably within a range between 50 and 90 atomic %.

The protective film in this invention has the oxidized surface layer containing X as a main component. In order to form the protective film having the oxidized layer on the multilayer reflective film, use is preferably made of a method of depositing the above-mentioned protective film on an upper surface of the multilayer reflective film and thereafter oxidizing a surface of the protective film. In order to oxidize the surface of the protective film, use may be made of forced oxidation by oxygen ashing or natural oxidation.

Preferably, the oxidized layer in the protective film is smaller in thickness than the entire protective film and has a thickness within a range between 0.5 nm and 1.5 nm. If the thickness of the oxidized layer is smaller than 0.5 nm, the above-mentioned effect of improving the dry etching resistance and the chemical resistance according to this invention is insufficient. On the other hand, if the thickness of the oxidized layer is greater than 1.5 nm, the reflectance within the reflection region for the exposure light may possibly be decreased.

The thickness of the protective film in this invention is preferably selected within a range between 0.8 nm and 5 nm. If the thickness of the protective film is smaller than 0.8 nm, various kinds of resistances required as the protective film may not be obtained. On the other hand, if the thickness is greater than 5 nm, the EUV absorbance of the protective film may be increased to decrease the reflectance on the multilayer reflective film. More preferably, the protective film has a thickness such that the reflectance on the multilayer reflective film is maximized.

Preferably, the protective film in this invention is made of RuNb. In this event, in combination with presence of the oxidized surface layer containing Nb as a main component, the resistance of the protective film against dry etching is significantly improved particularly when the buffer film is etched by using an etching gas containing a chlorine-based gas. In addition, the chemical resistance is more effectively exhibited.

The protective film in this invention may contain nitrogen (N). The protective film containing nitrogen is desirable because film stress is decreased while adhesion between the protective film and the multilayer reflective film, the absorber film, or the buffer film is improved. The content of nitrogen is preferably within a range between 2 and 30 atomic %, more preferably within a range between 5 and 15 atomic %.

The above-mentioned protective film need not have a uniform composition throughout the entire film. For example, the protective film may have a composition gradient such that a composition is different in a thickness direction. In case where the protective film has the composition gradient, the composition of elements contained in the protective film may be different either continuously or stepwise.

In addition, a buffer film different in etching property from the absorber film may be formed between the protective film and the absorber film. By forming the buffer film, the multilayer reflective film is prevented from being damaged by etching during pattern formation and pattern correction of the absorber film. In particular, the buffer film made of a chromium-based material containing chromium has a high smoothness and the surface of the absorber film formed thereon also has a high smoothness. Therefore, pattern blurring is reduced.

As a material of the chromium-based buffer film, use may be made of an elemental substance of chromium (Cr) or a material containing chromium (Cr) and at least one kind of element selected from a group consisting of nitrogen (N), oxygen (O), carbon (C), and fluorine (F). For example, the buffer film containing nitrogen is excellent in smoothness. The buffer film containing carbon is improved in etching resistance under a dry etching condition of the absorber film. The buffer film containing oxygen is reduced in film stress. Specifically, CrN, CrO, CrC, CrF, CrON, CrCO, CrCON, or the like is preferably used as the material of the buffer film.

The reflective mask blank may be provided with a resist film for use in forming a predetermined transfer pattern by patterning the absorber film.

The reflective mask obtained by using the above-mentioned reflective mask blank may be specified by the following aspects.

(1) A reflective mask comprising a substrate, a multilayer reflective film formed on the substrate, a protective film formed on the multilayer reflective film, a buffer film formed on the protective film, and an absorber film pattern formed on the buffer film and having a predetermined transfer pattern.

(2) A reflective mask comprising a substrate, a multilayer reflective film formed on the substrate, a protective film formed on the multilayer reflective film, a buffer film pattern formed on the protective film and having a predetermined transfer pattern, and an absorber film pattern formed on the buffer film pattern and having the predetermined transfer pattern.

(3) A reflective mask comprising a substrate, a multilayer reflective film formed on the substrate, a protective film formed on the multilayer reflective film, and an absorber film pattern formed on the protective film and having a predetermined transfer pattern.

FIGS. 1A to 1D are schematic sectional views for describing a reflective mask blank according to one embodiment of this invention and a process of producing a reflective mask by using the reflective mask blank.

Referring to FIG. 1A, the reflective mask blank according to one embodiment of this invention comprises a substrate 1, a multilayer reflective film 2 formed on the substrate 1, a protective film 6 formed on the multilayer reflective film 2, a buffer film 3 formed on the protective film 6, and an absorber film 4 formed on the buffer film 3.

In order to prevent pattern distortion due to heat generation during exposure, the substrate 1 preferably has a low coefficient of thermal expansion within a range of $0 \pm 1.0 \times 10^{-7}/°C.$, more preferably within a range of $0 \pm 0.3 \times 10^{-7}/°C$. As a material having a low coefficient of thermal expansion within the above-mentioned range, use may be made of an amorphous glass, a ceramic, or a metal. For example, the amorphous glass may be a $SiO_2$—$TiO_2$ glass or a quartz glass while a crystallized glass may be a crystallized glass in which a β-quartz solid solution is precipitated. As an example of a metal substrate, use may be made of an Invar alloy (Fe—Ni alloy). Alternatively, a single-crystal silicon substrate may be used.

In order to achieve a high reflectance and a high transfer accuracy, the substrate 1 preferably has a high smoothness and a high flatness. In particular, the substrate 1 preferably has a smooth surface having a smoothness of 0.2 nmRms or less (smoothness in a 10 μm square area) and a flatness of 100 nm or less (flatness in a 142 mm square area). In order to prevent deformation due to a film stress of a film formed thereon, the substrate 1 preferably has a high stiffness or rigidity. In particular, the substrate 1 preferably has a high Young's modulus of 65 GPa or more.

It is noted here that the unit Rms representative of the smoothness is a root mean square roughness which can be measured by an atomic force microscope. On the other hand, the flatness is a value indicative of surface warp (deformation) given by TIR (Total Indicated Reading) and is an absolute value of a difference in height between the highest position and the lowest position of a substrate surface located above and below a focal plane, respectively, where the focal plane is a plane determined by the least square method with reference to the substrate surface.

As described above, the multilayer reflective film 2 is a multilayer film comprising a plurality of elements different in refractive index from one another and cyclically or periodically laminated. Generally, use is made of a multilayer film comprising thin films of a heavy element or a compound thereof and thin films of a light element or a compound thereof which are alternately laminated in about 40 to 60 cycles or periods.

For example, as a multilayer reflective film for EUV light having a wavelength between 13 and 14 nm, use is preferably made of the above-mentioned periodic Mo/Si multilayer film comprising Mo and Si thin films alternately laminated in about 40 periods. As a multilayer reflective film for use in an EUV region, use may also be made of a periodic Ru/Si multilayer film, a periodic Mo/Be multilayer film, a periodic Mo-compound/Si-compound multilayer film, a periodic Si/Nb multilayer film, a periodic Si/Mo/Ru multilayer film, a periodic Si/Mo/Ru/Mo multilayer film, a periodic Si/Ru/Mo/Ru multilayer film, or the like. Depending on an exposure wavelength, the material of the multilayer reflective film 2 is appropriately selected.

The multilayer reflective film 2 may be formed by depositing respective layers using DC magnetron sputtering, ion beam sputtering, or the like. For example, the above-mentioned periodic Mo/Si multilayer film may be formed in the following manner. By ion beam sputtering, a Si film having a thickness of several nanometers is at first deposited by using a Si target. Then, using a Mo target, a Mo film having a thickness of several nanometers is deposited. A combination of the Si film of several nanometers and the Mo film of several nanometers is defined as a single period. In the above-mentioned manner, these films are laminated in 40 to 60 periods. Finally, in order to protect the multilayer reflective film, the protective film using the material according to this invention is formed. The protective film is formed on the multilayer reflective film in the manner described above.

As the buffer film 3, the chromium-based buffer film mentioned above is preferably used. The buffer film 3 may be formed on the protective film by sputtering such as DC sputtering, RF sputtering, and ion beam sputtering.

The buffer film 3 preferably has a thickness within a range between 20 and 60 nm in case where the absorber film pattern is corrected by using a focused ion beam (FIB), but may be within a range between 5 and 15 nm in case where the FIB is not used.

Next, the absorber film 4 has a function of absorbing the exposure light, for example, the EUV light. As the absorber film 4, use is preferably made of an elemental substance of tantalum (Ta) or a material containing Ta as a main component. Generally, the material containing Ta as a main component is a Ta alloy. The absorber film preferably has an amorphous structure or a microcrystal structure in view of the smoothness and the flatness.

As the material containing Ta as a main component, use may be made of a material containing Ta and B, a material containing Ta and N, a material containing Ta, B, and at least one of O and N, a material containing Ta and Si, a material containing Ta, Si, and N, a material containing Ta and Ge, a material containing Ta, Ga, and N, and so on. By addition of B, Si, Ge, or the like to Ta, an amorphous material is easily obtained so as to improve the smoothness. On the other hand, by addition of N or O to Ta, oxidation resistance is improved so that an effect of improving stability over time is obtained.

Among others, the material containing Ta and B (the composition ratio Ta/B falling within a range between 8.5/1.5 and 7.5/2.5) and the material containing Ta, B, and N (the content of N being 5 to 30 atomic % and, with respect to the balance assumed as 100 atomic %, the ratio of B being 10 to 30 atomic %) are particularly preferable. In case of these materials, a microcrystal structure or an amorphous structure is easily obtained so as to achieve an excellent smoothness and an excellent flatness.

Preferably, the absorber film consisting of an elemental substance of Ta or containing Ta as a main component is formed by sputtering such as magnetron sputtering. For example, a TaBN film may be deposited by sputtering using a target containing tantalum and boron and a nitrogen-added argon gas. When the absorber film is formed by sputtering, an internal stress can be controlled by changing a power supplied to the sputtering target or a pressure of the gas supplied. Furthermore, since the absorber film can be formed at a low temperature such as a room temperature, it is possible to reduce an influence of heat upon the multilayer reflective film and other films.

As the absorber film, a material such as WN, TiN, or Ti may be used instead of the material containing Ta as a main component.

The absorber film 4 may have a multilayer structure comprising a plurality of layers different in material or composition.

The absorber film 4 must have a thickness such that the exposure light, such as the EUV light, is sufficiently absorbed. Generally, the absorber film 4 has a thickness within a range between 30 and 100 nm.

In the embodiment illustrated in FIGS. 1A to 1D, the reflective mask blank 10 has the above-mentioned structure and includes the buffer film. However, depending on the method of patterning the absorber film 4 or the method of correcting a pattern formed by patterning the absorber film 4, the buffer film may not be formed.

Next, description will be made of the process of producing the reflective mask using the above-mentioned mask blank 10.

Each of the layers of the reflective mask blank 10 (see FIG. 1A) is formed by using the material and the method described above.

By patterning the absorber film 4 of the reflective mask blank 10, a predetermined transfer pattern is formed. At first, a resist for electron beam lithography (EB resist) is applied on the absorber film 4 and baked. Next, using an electron beam writer, predetermined pattern writing is performed. Then, development is performed to form a predetermined resist pattern 5a.

Figure 1B:
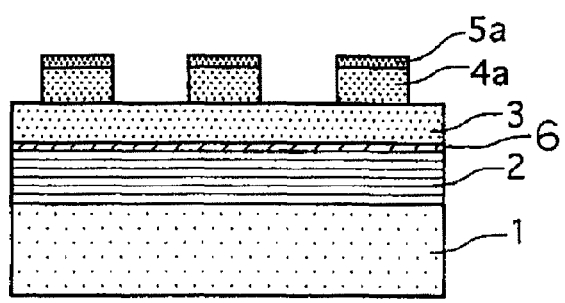

Using the resist pattern 5a as a mask, the absorber film 4 is dry-etched to form an absorber film pattern 4a having a predetermined transfer pattern (see FIG. 1B). In case where the absorber film 4 is made of a material containing Ta as a main component, dry etching with a chlorine gas may be used.

Figure 1C:
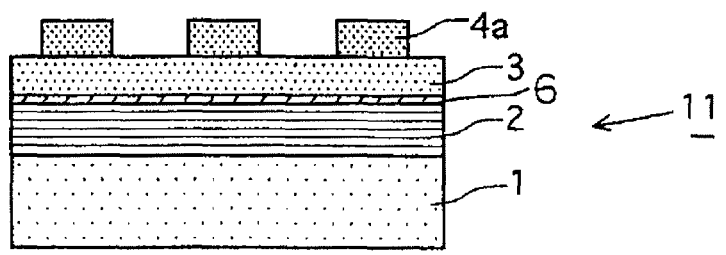
Figure 1D:
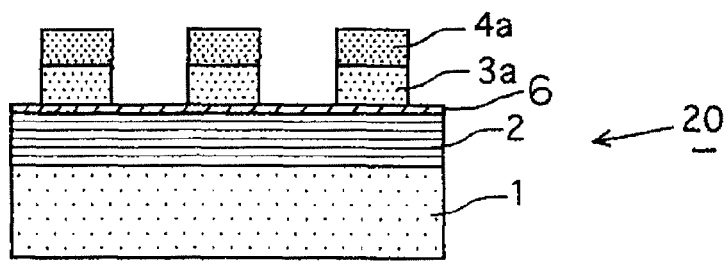

Then, the resist pattern 5a left on the absorber film pattern 4a is removed by using a hot concentrated sulfuric acid to produce a mask 11 (see FIG. 1C).

Generally, the mask 11 is subjected to inspection to detect whether or not the absorber film pattern 4a is formed exactly as designed. In the inspection of the absorber film pattern 4a, for example, DUV (deep ultraviolet) light having a wavelength within a range between 190 nm and 260 nm is used as inspection light. The inspection light is incident to the mask 11 having the absorber film pattern 4a. Herein, the inspection is performed by detecting the inspection light reflected on the absorber film pattern 4a and the inspection light reflected by the buffer film 3 exposed after the absorber film 4 is partly removed and observing the contrast therebetween.

In the above-mentioned manner, for example, a pinhole defect (white defect) and an underetching (insufficient etching) defect (black defect) are detected. The pinhole defect (white defect) is caused by undesired removal of a necessary part of the absorber film which should not be removed. The underetching defect (black defect) is an unnecessary part of the absorber film which is undesirably left due to underetching. If the pinhole defect or the underetching defect is detected, the defect is corrected.

In order to correct the pinhole defect, for example, use may be made of a method of depositing a carbon film or the like in a pinhole by FIB (Focused Ion Beam)-assisted deposition. In order to correct the underetching defect, use may be made of a method of removing the unnecessary part by FIB irradiation. In this case, the buffer film 3 serves as a protective film for protecting the multilayer reflective film 2 against the FIB irradiation.

After completion of the pattern inspection and the pattern correction, an exposed part of the buffer film 3 is removed according to the absorber film pattern 4a to form a buffer film pattern 3a on the buffer film 3. Thus, a reflective mask 20 is produced (see FIG. 1D). For example, in case of the buffer film 3 made of a Cr-based material, dry etching may be performed by the use of a mixed gas containing chlorine and oxygen. In an area where the buffer film 3 is removed, the multilayer reflective film 2 as a reflection region for the exposure light is exposed. On the multilayer reflective film 2 thus exposed, the protective film 6 made of a protective film material according to this invention is formed. At this time, the protective film 6 serves to protect the multilayer reflective film 2 against dry etching of the buffer film 3.

If a desired reflectance is obtained without removing the buffer film, the buffer film may be left on the multilayer reflective film having the protective film without processing the buffer film into a pattern similar to that of the absorber film.

Finally, final inspection is carried out to confirm whether or not the absorber film pattern 4a is formed with a dimensional accuracy according to specifications. Also in the final inspection, the above-mentioned DUV light is used.

The reflective mask produced by using the reflective mask blank according to this invention is particularly advantageous when the EUV light (having a wavelength in a range between 0.2 and 100 nm) is used as the exposure light. However, the reflective mask may be appropriately used for light having a different wavelength.

EXAMPLES

Hereinafter, the embodiment of this invention will be described more in detail with reference to specific examples.

Example 1

A $SiO_2$—$TiO_2$ glass substrate (6-inch square, 6.3 mm thick) was used as a substrate. The glass substrate had a coefficient of thermal expansion of $0.2 \times 10^{-7}/°$ C. and a Young's modulus of 67 GPa. The glass substrate was polished by mechanical polishing to have a smooth surface of 0.2 nmRms or less and a flatness of 100 nm or less.

As a multilayer reflective film formed on the substrate, a periodic Mo/Si multilayer reflective film was used so as to be suitable for an exposure wavelength band between 13 and 14 nm. Specifically, the multilayer reflective film was formed by alternately laminating Mo and Si films on the substrate by ion beam sputtering using a Mo target and a Si target. Herein, a combination of the Si film having a thickness of 4.2 nm and the Mo film having a thickness of 2.8 nm is defined as a single period. After these films were laminated in 40 periods, deposition of the Si film to a thickness of 4.2 nm was performed at an end of deposition of the multilayer reflective film. Finally, an RuNb film as a protective film was deposited to a thickness of 2.5 nm by using an RuNb target. Then, a surface of the RuNb protective film was oxidized by oxygen ashing to form an oxidized surface layer. The oxidized surface layer was subjected to composition analysis by X-ray photoelectron spectroscopy (XPS). As a result, it was confirmed that the oxidized surface layer contained Nb as a main component. The oxidized surface layer had a thickness of 1.5 nm.

In the above-mentioned manner, a substrate with the multilayer reflective film was obtained. EUV light having a wavelength of 13.5 nm was incident to the multilayer reflective film at an incident angle of 6.0 degrees. Then, the reflectance was measured. As a result, the reflectance was 65.9%.

Next, on the protective film of the substrate with the multilayer reflective film obtained as mentioned above, a buffer film was formed. As the buffer film, a chromium nitride (CrNx) film was formed to a thickness of 20 nm. The CrNx film was deposited by DC magnetron sputtering using a Cr target and a mixed gas of argon (Ar) and nitrogen ($N_2$) as a sputtering gas. In the CrNx film thus deposited, the content of nitrogen (N) was 10 atomic % (x=0.1).

Next, on the buffer film, a TaBN film made of a material containing Ta, B, and N was formed as an absorber film to a thickness of 80 nm. Specifically, the TaBN film was deposited by DC magnetron sputtering using a target containing Ta and B and a sputtering gas containing argon (Ar) with 10% nitrogen ($N_2$) added thereto. The TaBN film thus deposited had a composition of 80 at % Ta, 10 at % B and 10 at % N.

Next, using the above-mentioned reflective mask blank, a reflective mask for EUV exposure, which has a pattern for a 16 Gbit-DRAM of a 0.07 μm design rule, was produced in the following manner.

At first, a resist film for electron beam lithography was formed on the above-mentioned reflective mask blank. By using an electron beam writer, predetermined pattern writing was performed. After the writing, development was performed to form a resist pattern.

Next, with the resist pattern used as a mask, the absorber film was dry-etched with a chlorine gas to form a transfer pattern as the absorber film pattern.

Furthermore, according to the absorber film pattern, the buffer film left on the reflection region (where no absorber film pattern was present) was removed by dry etching using a mixed gas of chlorine and oxygen to thereby expose the multilayer reflective film having the protective film on its surface. Thus, the reflective mask was obtained. In case of the RuNb protective film having a Nb oxidized layer on its surface, the etching selectivity of the buffer film to the protective film is 20:1.

The reflective mask thus obtained was subjected to final inspection. As a result, it was confirmed that the pattern for the 16 Gbit-DRAM of the 0.07 μm design rule was formed exactly as designed. The reflectance for the EUV light in the reflection region was not substantially changed from that of the substrate with the multilayer reflective film and was equal to 65.8%.

The reflective mask thus obtained was subjected to ozone-water cleaning to be performed upon occurrence of haze. As a result, the reflectance for the EUV light in the reflective region was not substantially changed from the above-mentioned reflectance and was equal to 65.7%. Thus, it was confirmed that the reflective film had a sufficient resistance against the ozone-water cleaning also.

Figure 2:
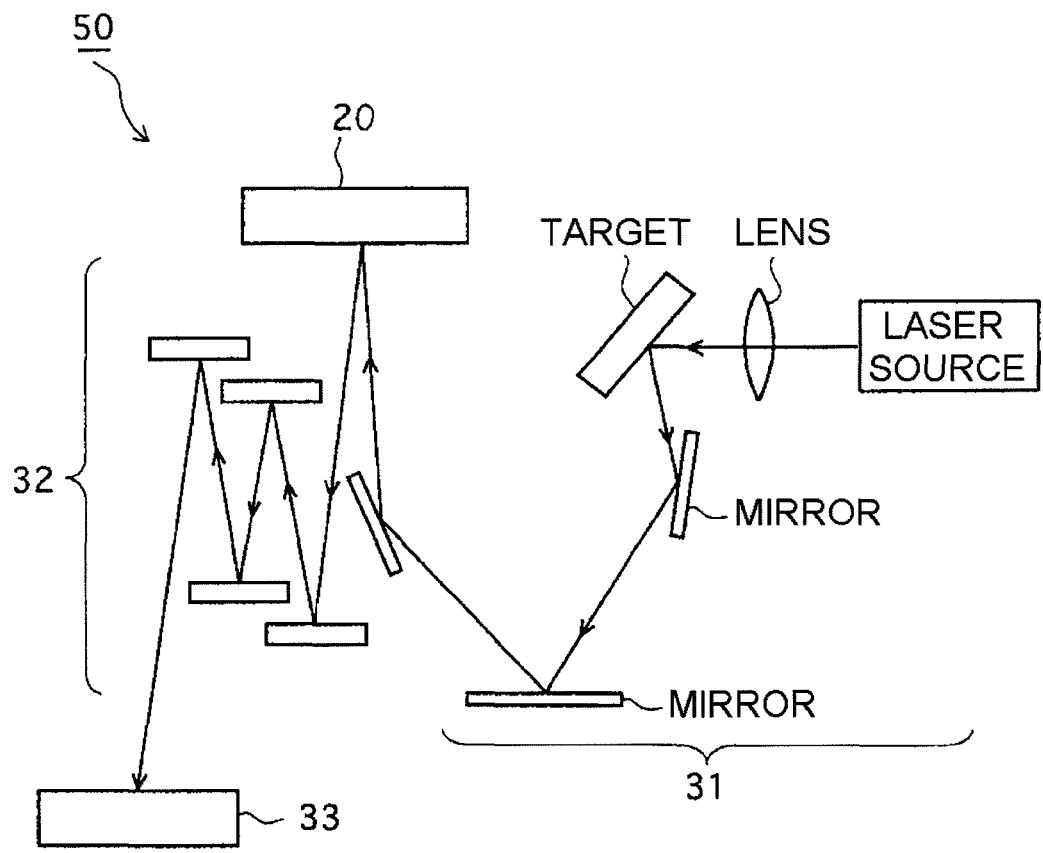
FIG. 2 is a schematic view of a pattern transfer apparatus with the reflective mask mounted thereto.
Figure 3:
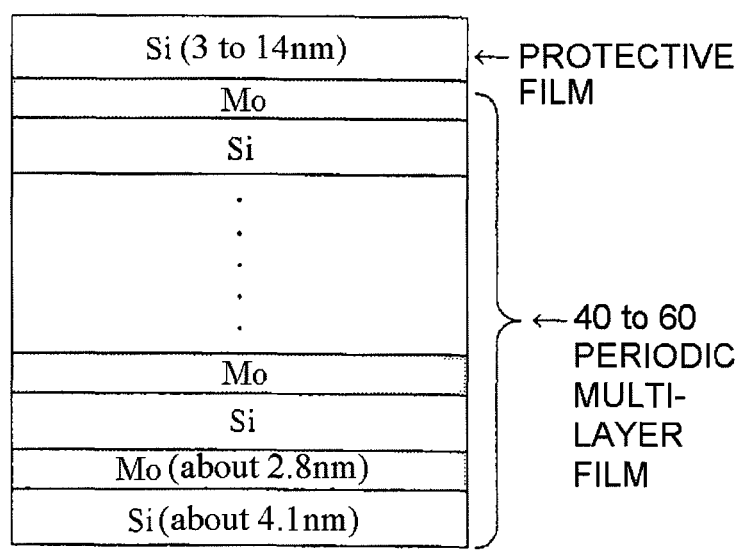
FIG. 3 is a sectional view of a conventional periodic Mo/Si multilayer reflective film.

Then, using the reflective mask in this embodiment obtained as mentioned above, pattern transfer onto a semiconductor substrate by exposure with EUV light was performed by the use of a pattern transfer apparatus 50 illustrated in FIG. 2.

The pattern transfer apparatus 50 with the reflective mask mounted thereto comprises a laser plasma X-ray source 31, a reduction optical system 32, and so on. The reduction optical system 32 uses an X-ray reflection mirror. A pattern image formed by light reflected by the reflective mask 20 is generally reduced to about ¼. Since a wavelength band of 13 to 14 nm was used as an exposure wavelength, setting was preliminarily made so that an optical path was in vacuum.

In the above-mentioned state, the EUV light obtained from the laser plasma X-ray source 31 was incident to the reflective mask 20. The image formed by the light reflected by the reflective mask 20 was transferred by exposure onto a silicon wafer (semiconductor substrate with a resist layer) 33 through the reduction optical system 32.

The light incident to the reflective mask 20 was absorbed by the absorber film and was not reflected in an area where the absorber film pattern 4*a* (see FIG. 1D) was present. On the other hand, the light incident to another area where the absorber film pattern 4*a* was not present was reflected by the multilayer reflection film. Thus, the light reflected by the reflective mask 20 to form the image was incident to the reduction optical system 32. A transfer pattern was exposed onto the resist layer on the silicon wafer 33 by the light passing through the reduction optical system 32. By developing the resist layer thus exposed, a resist pattern was formed on the silicon wafer 33.

As mentioned above, pattern transfer onto the semiconductor substrate was performed. As a result, it was confirmed that the accuracy of the reflective mask in this embodiment was 16 nm or less as required in the 70 nm design rule.

Example 2

A substrate with a multilayer reflective film was produced in the manner similar to Example 1 except that the material of the protective film in Example 1 was changed to RuZr. The RuZr protective film was deposited to a thickness of 2.5 nm by ion beam sputtering using an RuZr target. Then, a surface of the RuZr protective film was oxidized by oxygen ashing to form an oxidized surface layer. The oxidized surface layer was subjected to composition analysis by X-ray photoelectron spectroscopy (XPS). As a result, it was confirmed that the oxidized surface layer contained Zr as a main component. The oxidized surface layer had a thickness of 1.5 nm.

In the above-mentioned manner, a substrate with the multilayer reflective film was obtained. EUV light having a wavelength of 13.5 nm was incident to the multilayer reflective film at an incident angle of 6.0 degrees. Then, the reflectance was measured. As a result, the reflectance was 65.8%.

Next, on the protective film of the substrate with the multilayer reflective film obtained as mentioned above, an absorber film was formed. Specifically, a TaBN film was deposited by DC magnetron sputtering using a target containing Ta and B and a sputtering gas containing argon (Ar) with 10% nitrogen ($N_2$) added thereto. Thus, a reflective mask blank in this embodiment was obtained. The TaBN film thus deposited had a composition of 80 at % Ta, 10 at % B and 10 at % N.

Next, using the above-mentioned reflective mask blank, a reflective mask for EUV exposure, which has a pattern for a 16 Gbit-DRAM of a 0.07 μm design rule, was produced in the following manner.

At first, a resist film for electron beam lithography was formed on the above-mentioned reflective mask blank. By using an electron beam writer, predetermined pattern writing was performed. After the writing, development was performed to form a resist pattern.

Next, with the resist pattern used as a mask, the absorber film was dry-etched with a fluorine gas to form a transfer pattern as the absorber film pattern to thereby expose the multilayer reflective film having the protective film on its surface. Thus, the reflective mask was obtained. In case of the RuZr protective film having a Zr oxidized layer on its surface, the etching selectivity of the absorber film to the protective film is 20:1.

The reflective mask thus obtained was subjected to final inspection. As a result, it was confirmed that the pattern for the 16 Gbit-DRAM of the 0.07 μm design rule was formed exactly as designed. The reflectance for the EUV light in the reflection region was not substantially changed from that of the substrate with the multilayer reflective film and was equal to 65.7%.

The reflective mask thus obtained was subjected to ozone-water cleaning to be performed upon occurrence of haze. As a result, the reflectance for the EUV light in the reflective region was not substantially changed from the above-mentioned reflectance and was equal to 65.6%. Thus, it was confirmed that the reflective film had a sufficient resistance against the ozone-water cleaning also.

Then, pattern transfer onto a semiconductor substrate was performed by the use of the pattern transfer apparatus 50 illustrated in FIG. 2. As a result, it was confirmed that the accuracy of the reflective mask in this embodiment was 16 nm or less as required in the 70 nm design rule.

Next, a comparative example will be described.

Comparative Example

In the manner similar to Example 1, Si films and Mo films were laminated on a substrate in 40 periods where a combination of a Si film having a thickness of 4.2 nm and a Mo film having a thickness of 2.8 nm was defined as a single period. Thereafter, a Si film was deposited to a thickness of 4.2 nm. Finally, an Ru film as a protective film was deposited to a thickness of 2.0 nm. Thus, a substrate with a multilayer reflective film was obtained. EUV light having a wavelength of 13.5 nm was incident to the multilayer reflective film at an incident angle of 6.0 degrees. As a result, the reflectance was 65.9%.

Next, using the above-mentioned substrate with a multilayer reflective film, a reflective mask blank and a reflective mask were produced in the manner similar to Example 1. The Ru protective film is low in etching resistance against an oxygen-rich chlorine-based gas. Therefore, the buffer film was dry etched by using a mixed gas of oxygen and chlorine with an oxygen content of 20%.

The reflective mask thus obtained was subjected to ozone-water cleaning to be performed upon occurrence of haze. As a result, the reflectance for the EUV light in the reflective region was further decreased by 1.4% as compared with the above-mentioned reflectance. Thus, it was confirmed that the resistance against ozone-water cleaning was insufficient.

As thus far been described, according to this invention, it is possible to obtain a mask blank and a mask each of which has a protective film constituting an antioxidation film for protecting a multilayer reflective film under the protective film and formed by oxidizing and/or nitriding a surface layer having a chemical resistance.

This invention is applicable not only to a mask blank and a mask for use in forming a pattern of a DRAM or the like but also to a mask blank and a mask for use in transfer of a pattern of various kinds of electronic devices, such as a TFT, by exposure.

What is claimed is:

1. A reflective mask blank comprising a substrate, a multilayer reflective film formed on the substrate to reflect exposure light, a protective film formed on the multilayer reflective film to protect the multilayer reflective film, and an absorber film formed on the protective film to absorb the exposure light, wherein:
the protective film is made of a ruthenium compound containing ruthenium (Ru) and X (X being at least one kind of material selected from niobium (Nb) and zirconium (Zr)) and has an oxidized surface layer containing X as a main component.

2. A reflective mask blank according to claim 1, wherein X is niobium (Nb).

3. A reflective mask blank according to claim 1 or 2, wherein the protective film has a thickness within a range between 0.8 nm and 5 nm.

4. A reflective mask blank according to claim 3, wherein the oxidized layer has a thickness within a range between 0.5 nm and 1.5 nm.

5. A reflective mask blank according to claim 1 or 2, wherein the oxidized layer has a thickness within a range between 0.5 nm and 1.5 nm.

6. A reflective mask blank according to claim 1 or 2, further comprising a buffer film formed between the protective film and the absorber film and different in etching property from the absorber film.

7. A reflective mask blank according to claim 6, wherein the buffer film is made of a chromium-based material containing chromium (Cr).

8. A reflective mask blank according to claim 7, wherein the buffer film is made of a material containing chromium nitride (CrN) as a main component.

9. A reflective mask blank according to claim 1 or 2, wherein the absorber film is made of a tantalum-based material containing tantalum (Ta).

10. A reflective mask blank according to claim 9, further comprising a buffer film is made of a chromium-based material containing chromium (Cr).

11. A reflective mask blank according to claim 10, wherein the buffer film is made of a material containing chromium nitride (CrN) as a main component.

12. A reflective mask blank according to claim 1 or 2, wherein the protective film further contains nitrogen.

13. A method of producing a reflective mask blank according to claim 1, wherein:
the protective film is deposited on an upper surface of the multilayer reflective film and thereafter a surface of the protective film is oxidized.

14. A method of producing a reflective mask, wherein an absorber film pattern as a transfer pattern to be transferred onto an object is formed by patterning the absorber film of the reflective mask blank according to claim 1.

15. A reflective mask blank according to claim 1, wherein the protective film contains the ruthenium which falls within a range between 10 and 95 atomic % in the ruthenium compound except for the oxidized surface layer.

16. A reflective mask blank according to claim 1, wherein the oxidized surface layer of the protective film withstands ozone-water cleaning.

17. A reflective mask blank according to claim 1, wherein the oxidized surface layer contains niobium as the main component and withstands dry etching which uses an etching gas containing a chlorine-based gas.

18. A reflective mask blank according to claim 1, wherein the oxidized surface layer contains zirconium as the main component and withstands dry etching which uses an etching gas containing a fluorine gas.

* * * * *